US006710509B1

(12) United States Patent
Kadota

(10) Patent No.: US 6,710,509 B1
(45) Date of Patent: Mar. 23, 2004

(54) SURFACE ACOUSTIC WAVE DEVICE

(75) Inventor: Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/038,717

(22) Filed: Jan. 28, 1998

(30) Foreign Application Priority Data

Feb. 7, 1997 (JP) ............................................ 9-025001

(51) Int. Cl.[7] ................................................ H01L 41/08

(52) U.S. Cl. .............................. 310/313 A; 310/313 R; 310/346

(58) Field of Search ......................... 310/313 R, 313 A, 310/346; 333/193–196

(56) References Cited

U.S. PATENT DOCUMENTS 5,719,538 A * 2/1998 Kadota ....................... 333/193
5,923,231 A * 7/1999 Ohkubo et al. ............. 333/193
6,310,424 B1 * 10/2001 Ogura et al. ............ 310/313 R
6,310,425 B1 * 10/2001 Tanaka ................... 310/313 R

FOREIGN PATENT DOCUMENTS

JP 61-222312 10/1986

* cited by examiner

*Primary Examiner*—Mark Budd
(74) *Attorney, Agent, or Firm*—Keating & Bennett, LLP

(57) ABSTRACT

A surface acoustic wave device includes a quartz substrate, a piezoelectric thin film disposed on the quartz substrate and an interdigital electrode in contact with the piezoelectric thin film. The quartz substrate has an angle $\phi$ at the Euler angle $(0, \phi, \theta)$ which is selected such that the quartz substrate has a negative temperature coefficient of delay at a predetermined propagation direction $\theta$. The piezoelectric thin film has a positive temperature coefficient of delay, a thickness which is selected such that a fundamental mode of a leaky surface acoustic wave is excited on the quartz substrate, and the surface acoustic wave device operates using the fundamental mode of the leaky surface acoustic wave. It is preferable that the surface acoustic wave device has a quartz substrate with a Euler angle (0, 119°–138°, 85°–95°) and the normalized thickness of the piezoelectric thin film within the range of about 0.01 to about 0.15.

8 Claims, 6 Drawing Sheets

SURFACE ACOUSTIC WAVE DEVICE

BACKGROUND OF THE INVENTION

1. Field of the Invention

The present invention relates to a surface acoustic wave device having a quartz substrate, and more particularly, to a surface acoustic wave device which is adapted to generate a fundamental mode of a leaky surface acoustic wave.

2. Description of the Related Art

A surface acoustic wave (SAW) device has been widely used as, for example, a bandpass filter in mobile communications equipment. Generally, a surface acoustic wave device has a piezoelectric substrate and at least one interdigital transducer (IDT) including at least one pair of comb-shaped electrodes disposed on the piezoelectric substrate. The substrate material of the surface acoustic wave device may be a piezoelectric single crystal such as $LiNbO_3$, $LiTaO_3$, or quartz, and piezoelectric ceramics such as PZT piezoelectric ceramics.

In order to achieve wide band characteristics in the surface acoustic wave device, a piezoelectric material must have a large electromechanical coupling coefficient. In some specific applications, the piezoelectric material is further required to have a good temperature characteristic, that is, the frequency shift of its filter characteristics caused by a change of temperature must be small.

Quartz is known as a substrate material having a small temperature coefficient of delay (TCD) among the aforementioned piezoelectric materials. Therefore, there have been proposed various types of surface acoustic wave devices each using a quartz substrate.

However, if Rayleigh waves are excited on a quartz substrate, there arises a problem that the electromechanical coupling coefficient is undesirably small. For example, the electromechanical coupling coefficient ks is at most 3.7% when a quartz substrate having an excellent TCD is used.

In addition, there arises a problem that the Rayleigh waves excited on the quartz substrate have such a small sound SAW that the surface acoustic wave device including the quartz substrate cannot be used in a high frequency device. Although it is known that a leaky surface acoustic wave having a relatively large sound velocity could be excited on a quartz substrate, the amount of decay of the leaky surface acoustic wave due to propagation is so great that the leaky surface acoustic wave is regarded as difficult to use.

For the aforementioned reasons, it is very difficult to realize a surface acoustic wave device which can operate at high frequencies and have a large electromechanical coupling coefficient and a small TCD.

For example, Japanese Laid-Open Patent Publication No. 61-222312 discloses a surface acoustic wave device in which a piezoelectric thin film is disposed on a quartz substrate and an IDT electrode is disposed on the piezoelectric thin film. This Japanese Patent publication discloses that a surface acoustic wave having an acoustic velocity about 1.7 times as large as that of a normal Rayleigh wave can be achieved by using a ST-cut quartz substrate and forming an electrode such that the propagation direction of the surface acoustic wave is perpendicular to the x-propagation direction. However, the surface acoustic wave that is regarded as available in this prior art is actually a combination of a surface shimming bulk wave (SSBW) and surface transverse wave (STW) which are close in frequency. Thus, it is difficult to be used in a surface acoustic wave resonator or the like.

For the foregoing reasons, there is a need for a surface acoustic wave device which has a small TCD and a large electromechanical coupling coefficient and is suitable for use at high frequencies.

SUMMARY OF THE INVENTION

The preferred embodiments of the present invention solves the aforementioned problems experienced in conventional devices. According to one preferred embodiment of the present invention, a surface acoustic wave device comprises a quartz substrate, a piezoelectric thin film disposed on the quartz substrate and an interdigital electrode disposed in contact with the piezoelectric thin film. The quartz substrate has an angle $\phi$ at the Euler angle $(0, \phi, \theta)$ which is selected such that the quartz substrate has a negative temperature coefficient of delay at a predetermined propagation direction $\theta$. The piezoelectric thin film has a positive temperature coefficient of delay and a thickness H which is selected such that a fundamental mode of a leaky surface acoustic wave is excited on the quartz substrate, and the surface acoustic wave device operates using the fundamental mode of the leaky surface acoustic wave.

A normalized film thickness $H/\lambda$ obtained by dividing the thickness H of the piezoelectric thin film by a wavelength $\lambda$ of the leaky surface acoustic wave to be excited is preferably within the range of about 0.01 to about 0.15.

The angle $\phi$ is preferably in the range of about 119° to about 167° and more preferably in the range of 119° to 138°.

The propagation direction $\theta$ is preferably in the range of about 85° to about 95°.

The piezoelectric thin film is preferably made of a material selected from the group consisting of ZnO, AlN, $Ta_2O_5$, or CdS.

The interdigital electrode may be disposed between the piezoelectric thin film and the quartz substrate. Further, the surface acoustic wave device may include a ground electrode disposed on the piezoelectric thin film.

In the surface acoustic wave device according to the preferred embodiments of the present invention, a quartz substrate has an angle $\phi$ selected such that a temperature coefficient of delay (TCD) becomes a negative value at the predetermined propagation direction while a piezoelectric thin film has a positive temperature coefficient of delay. Also, a piezoelectric thin film having a positive temperature coefficient of delay is provided on the quartz substrate. Therefore, the combination of the unique features of the quartz substrate and the piezoelectric thin film, including the respective negative temperature coefficient of delay and positive temperature coefficient of delay define a reduced value of TCD, thereby forming a composite substrate having a very small TCD.

Further, the thickness of the piezoelectric thin film is adapted to generate a fundamental mode of a leaky surface acoustic wave. Therefore, it is possible to provide a surface acoustic wave device that operates at the fundamental mode of a leaky surface acoustic wave and has a very small TCD.

In addition, in the case where a normalized film thickness of the piezoelectric thin film is set within the above specified preferred range, it is possible to form a surface acoustic wave device having not only a very small TCD, but a high electromechanical coupling coefficient.

Moreover, since the Euler angle of the quartz substrate is set at about (0, 119° to 167°, 85° to 95°), it is possible to reliably provide a surface acoustic wave device operating at the fundamental mode of a leaky surface acoustic wave and having a very small temperature coefficient and a large electromechanical coupling coefficient.

As For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

The preferred embodiments of the present invention are based on the inventor's discovery that a new surface acoustic wave device using a fundamental mode of a leaky surface acoustic wave and having excellent characteristics can be constructed if the problems associated with the decay of the leaky surface acoustic wave during the propagation are solved. As a result of intensive study, the inventor has discovered that the decay of the leaky surface acoustic wave during the propagation can be suppressed by arranging a piezoelectric thin film on the quartz substrate and that the TCD of the quartz substrate with the piezoelectric thin film can be made very small or substantially zero by using a quartz substrate having a negative TCD and a piezoelectric thin film having a positive TCD.

Hereinafter, the preferred embodiments of the present invention are explained in detail with reference to the drawings.

Figure 1A:
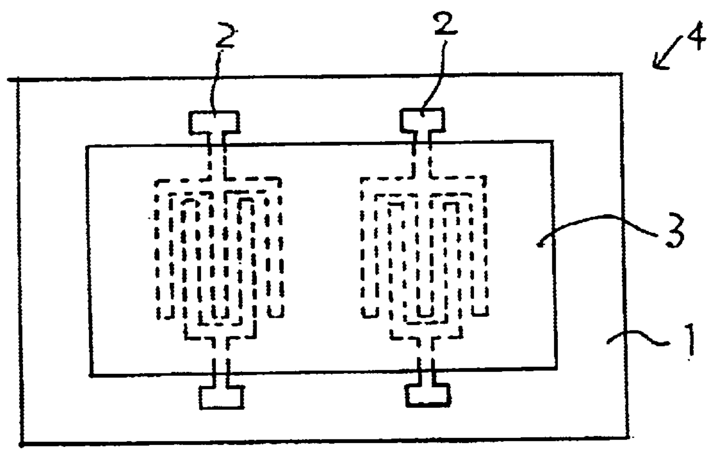
FIG. 1A is a plan view of a surface acoustic wave device according to a preferred embodiment of the present invention.
Figure 1B:
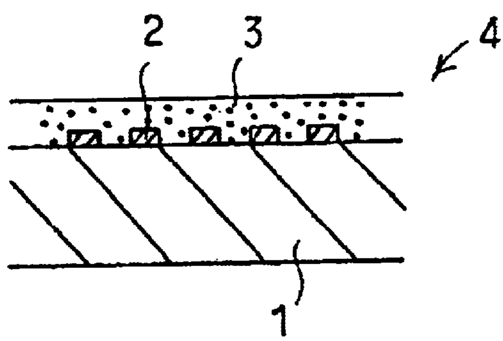
FIG. 1B is a cross-sectional view of a main portion of the surface acoustic wave device shown in FIG. 1A.

FIGS. 1A and 1B show a surface acoustic wave device 4 according to a preferred embodiment of the invention. The surface acoustic wave device 4 is a transversal type filter and, includes a quartz substrate 1, a piezoelectric thin film 3 disposed thereon and interdigital transducers 2. The interdigital transducers (IDTs) 2 are preferably disposed between the piezoelectric thin film 3 and the quartz substrate 1 so that the interdigital transducers 2 are in contact with the piezoelectric film 3. Each of the interdigital transducers 2 includes a set of comb-shaped electrodes interdigitated with each other.

Figure 2A:
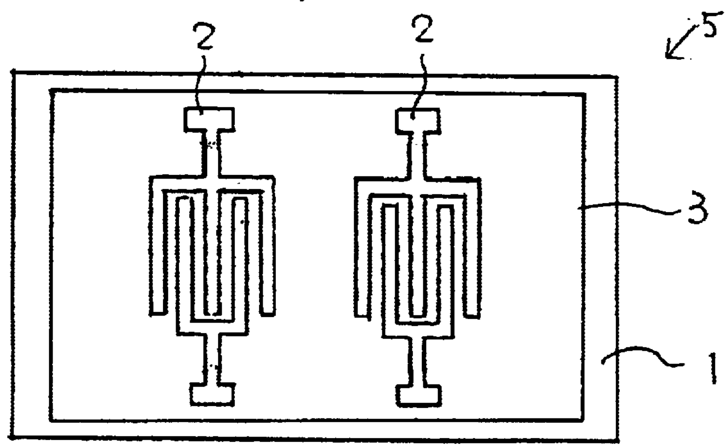
FIG. 2A is a plan view of a surface acoustic wave device according to another preferred embodiment of the present invention.
Figure 2B:
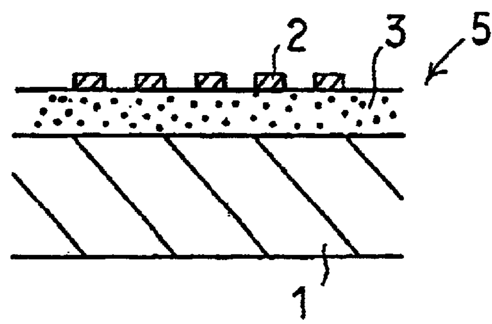
FIG. 2B is a cross-sectional view of a main portion of the surface acoustic wave device shown in FIG. 2A.

The interdigital transducers 2 may by provided on the piezoelectric thin film 3. Specifically, as shown in FIGS. 2A and 2B, in a surface acoustic wave device 5, the piezoelectric film 3 is provided on the quartz substrate 1 and the interdigital transducers 2 may be disposed on a top surface of the piezoelectric thin film 3.

Figure 3A:
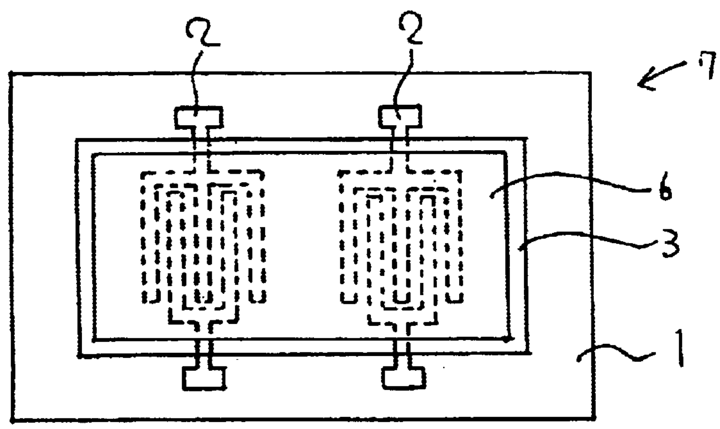
FIG. 3A is a plan view of a surface acoustic wave device according to still another preferred embodiment of the present invention.
Figure 3B:
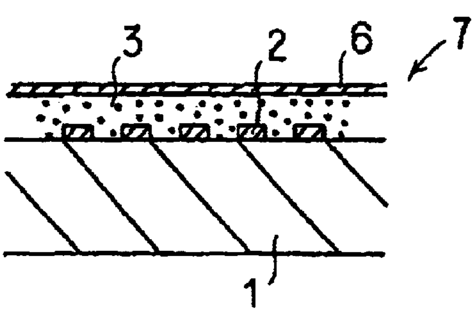
FIG. 3B is a cross-sectional view of a main portion of the surface acoustic wave device shown in FIG. 3A.

A surface acoustic wave device 4 according to a preferred embodiment of the invention may further include a ground electrode. As shown in FIGS. 3A and 3B, a surface acoustic wave device 7 comprises the quartz substrate 1, the piezoelectric thin film 3, the interdigital transducers 2 and a ground electrode 6. The ground electrode 6 is preferably provided on the piezoelectric thin film 3 so as to cover the interdigital transducers 2 provided between the quartz substrate 1 and the piezoelectric thin film 3.

The piezoelectric thin film used in the surface acoustic wave device according to this preferred embodiment of the invention is preferably made of ZnO, AlN, $Ta_2O_5$, or CdS. According to the inventor's discovery, a ZnO thin film is more preferable.

In the surface acoustic wave devices 4, 5 and 7, the quartz substrate preferably has a angle $\phi$ at the Euler angle (0, $\phi$, $\theta$) which is selected so as to impart a negative temperature coefficient of delay (TCD) at a predetermined propagation direction in which surface acoustic waves propagate. The piezoelectric thin film 3 has a thickness which allows excitation of a fundamental mode of a leaky surface acoustic wave on the quartz substrate 1. Further, the piezoelectric thin film 3 has a positive TCD.

In the surface acoustic wave device of this preferred embodiment of the invention, a fundamental mode of a leaky surface acoustic wave is a shear horizontal (SH) type surface wave having a displacement which is substantially perpendicular to the propagating direction of the surface wave and having a primary component which is substantially parallel to the surface of the substrate. For utilizing the SH type leaky surface acoustic wave, it is preferable that the propagation direction $\theta$ in which SH type leaky surface acoustic wave propagates is within the range of about 85° to about 95°. This means that the quartz substrate 1 preferably has a Euler angle (0, $\phi$, 85°–95°).

Figure 4:
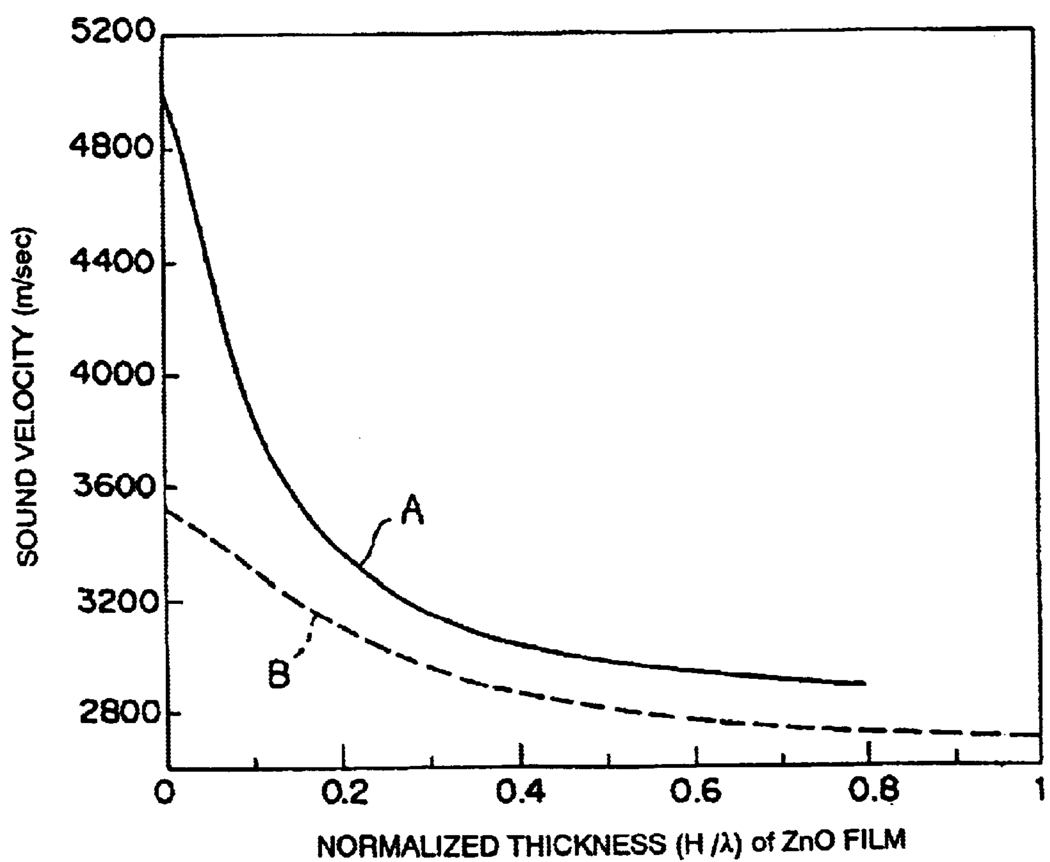
FIG. 4 is a graph showing the relationship between a normalized film thickness $H/\lambda$ of a ZnO thin film and the SAW velocity in the surface acoustic wave device in which the ZnO thin film is formed on a quartz substrate with Euler angle (0, 132°75', 90°).

FIG. 4 is a graph showing the relationship between the sound velocity of a surface acoustic wave and a normalized film thickness $H/\lambda$ of a ZnO thin film in a surface acoustic wave device in which an IDT is disposed on a quartz substrate having a Euler angle (0, 132°45', 89°) and the ZnO thin film is further located thereon in various thicknesses. The normalized film thickness $H/\lambda$ is defined as a value obtained by dividing the thickness $H(\mu m)$ of the piezoelectric thin film by the wavelength $\lambda(\mu m)$ of the surface acoustic wave to be excited. In FIG. 4, the line A represents a fundamental mode of a leaky surface acoustic wave and the line B represents a Rayleigh wave.

As is apparent from the FIG. 4, both a fundamental mode of a leaky surface acoustic wave and a Rayleigh wave are excited in the surface acoustic wave device, and the fundamental mode of a leaky surface acoustic wave having a SAW velocity greater than that of a Rayleigh wave can be excited by setting the normalized film thickness $H/\lambda$ of the ZnO thin film at required values.

Therefore, FIG. 4 reveals that the use of the above-mentioned quartz substrate makes it possible to excite the fundamental mode of the leaky surface acoustic wave having a higher SAW velocity than that of the Rayleigh wave.

It has been confirmed that the fundamental mode of a leaky surface acoustic wave is excited in both the ZnO thin film and the quartz substrate while the main component of the fundamental mode of the leaky surface acoustic wave exists in the ZnO thin film. Thus, the ZnO thin film and the quartz substrate act as a composite substrate.

Although not particularly shown in FIG. 4, a Sezawa wave, which is a higher mode of the Rayleigh wave, and a higher order mode of the leaky surface acoustic wave can be also excited in addition to the surface acoustic waves by setting the relative thickness $H/\lambda$ of the ZnO thin film at required values.

Figure 5:
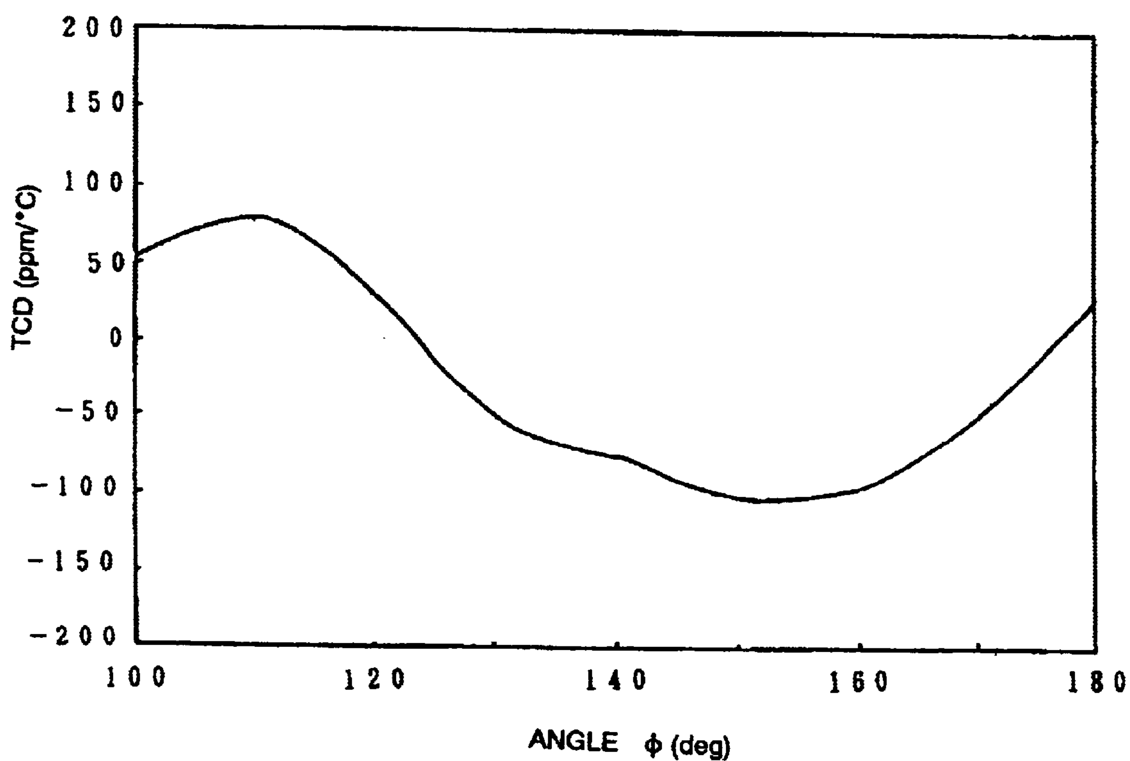
FIG. 5 is a graph showing the relationship between TCD and the cutting angle $\phi$ of the quartz substrate at the Euler angle (0, $\phi$, 90°).

FIG. 5 is a graph showing the relationship between TCD and the angle $\phi$ of the quartz substrate at the Euler angle (0, $\phi$, 90°). FIG. 5 shows that the TCD is varied by changing the angle $\phi$, and that the TCD has a negative value when the angle $\phi$ is within the range of about 123° to about 177°.

Figure 6:
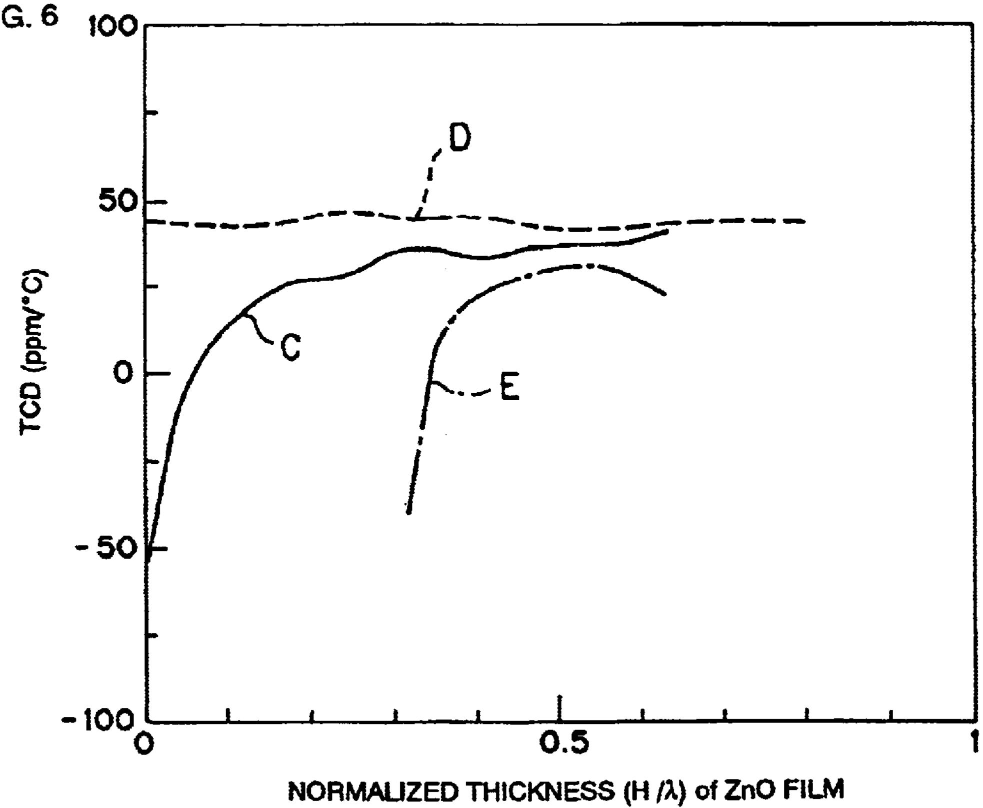
FIG. 6 shows the relationship between the TCD of the surface acoustic wave device having quartz substrate at the Euler angle (0, 132°45', 90°) and various normalized thicknesses of the ZnO thin film formed on the quartz substrate.

FIG. 6 shows the relationship between the TCD of the above-mentioned surface acoustic wave device having a quartz substrate at the Euler angle (0, 132°45', 90°) and various normalized thicknesses of the ZnO thin film disposed on the quartz substrate. In FIG. 6, the line C represents a fundamental mode of a leaky surface acoustic wave, the line D represents a Rayleigh wave, and the line E represents a higher order mode of the leaky surface acoustic wave.

FIG. 6 reveals that the TCD can become zero by setting the normalized film thickness $H/\lambda$ of the ZnO thin film at about 0.05 when the fundamental mode of the leaky surface acoustic wave is used.

This means that although the TCD of the quartz substrate at the Euler angle (0, 132°45', 90°) is negative, a fundamental mode of a leaky surface acoustic wave having a higher acoustic velocity than a Rayleigh wave is allowed to be excited by overlaying a ZnO thin film having a positive TCD, and the TCD can be made about zero.

Figure 7:
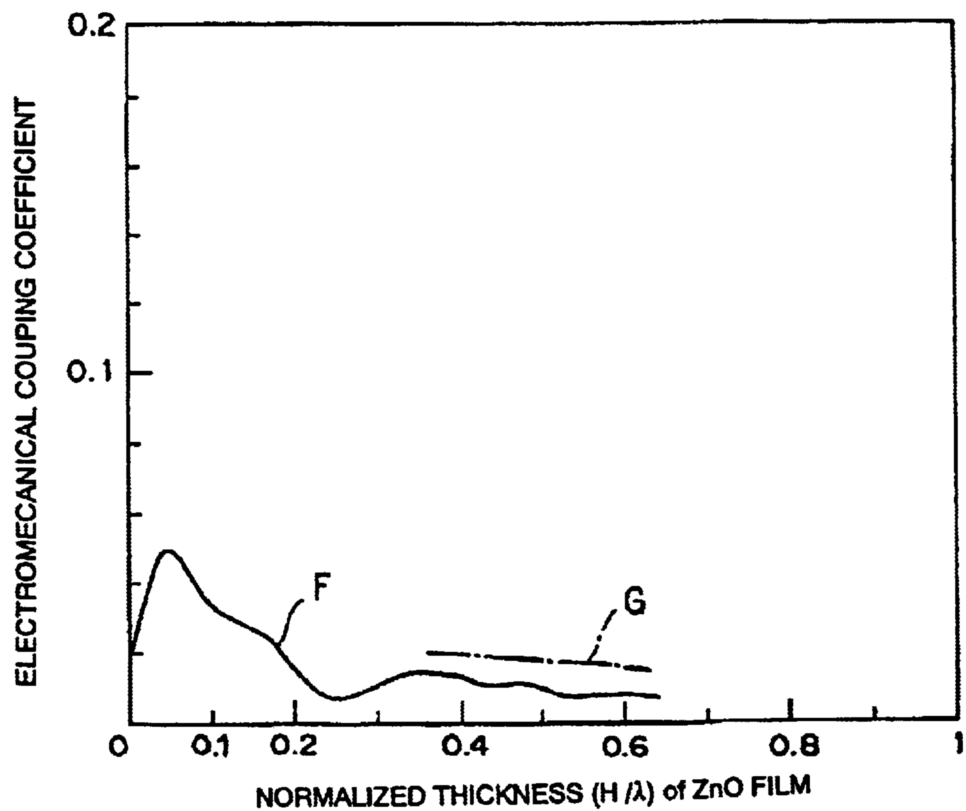
FIG. 7 is a graph showing the relationship between the electromechanical coupling coefficient and the normalized film thickness of the ZnO thin film in the surface acoustic wave device shown in FIGS. 1A and 1B.

FIG. 7 is a graph showing the relationship between the electromechanical coupling coefficient,and the normalized film thickness of the ZnO thin film in the surface acoustic wave device 4 shown in FIGS. 1A and 1B. In FIG. 7, the line F represents a fundamental mode of a leaky surface acoustic wave, and the line G represents a higher order mode of the leaky surface acoustic wave. As is understood from FIG. 7, the electromechanical coupling coefficient is more than about 0.03 in the surface acoustic wave device 4 when the normalized film thickness $H/\lambda$ of the ZnO thin film is within the range of about 0.01 to about 0.15. It is therefore possible to obtain a sufficiently large electromechanical coupling coefficient by setting the normalized film thickness $H/\lambda$ within the desired range. Moreover, in the case where the normalized film thickness $H/\lambda$ of the ZnO thin film is set at the value within the range of about 0.03 to about 0.08, the electromechanical coupling coefficient becomes more than about 0.04. This value cannot be obtained by a surface acoustic wave device using a conventional quartz substrate and a Rayleigh wave.

Therefore, when a quartz substrate having the angle $\phi$ and the propagation direction $\theta$ which are selected so as to give a negative TCD is used as a quartz substrate, a piezoelectric thin film disposed on the quartz substrate is selected to have a positive temperature coefficient of delay and the thickness $H/\lambda$ of the piezoelectric thin film is within the range of about 0.01 to about 0.15, it is possible to obtain a surface acoustic wave device that has a high electromechanical coupling coefficient and a very small TCD.

Figure 8:
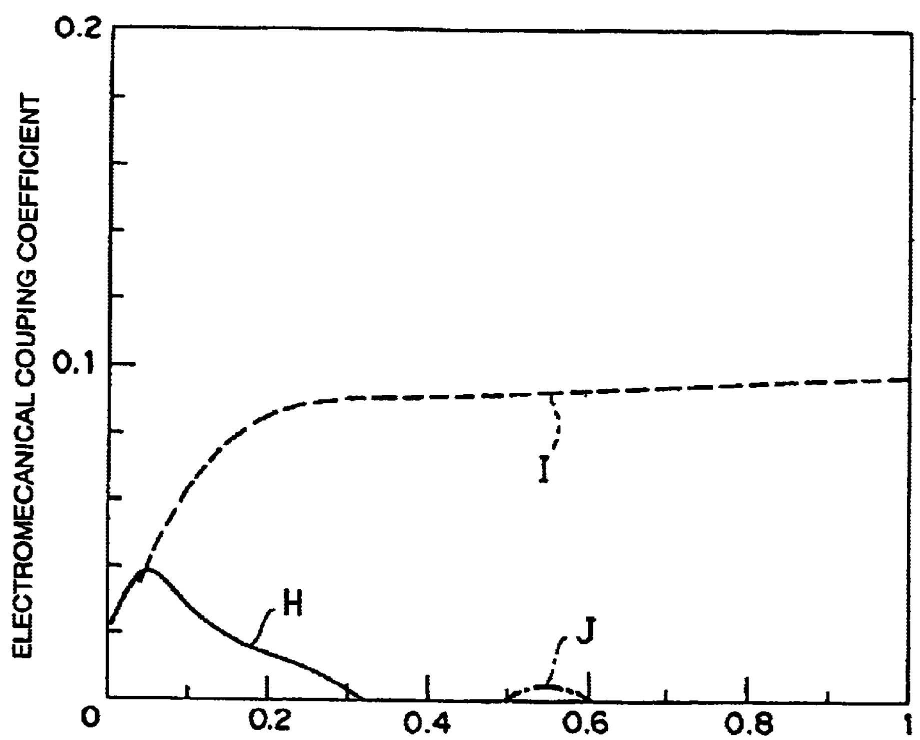
FIG. 8 a graph showing the relationship between the electromechanical coupling coefficient and the normalized film thickness of the ZnO thin film in the surface acoustic wave device shown in FIGS. 2A and 2B.

FIG. 8 is a graph showing the relationship between the electromechanical coupling coefficient and the normalized film thickness of the ZnO thin film in the surface acoustic wave device 5 shown in FIGS. 2A and 2B. In FIG. 8, the line H represents a fundamental mode of a leaky surface acoustic mode, the line I represents a Rayleigh wave, and the line J represents a higher mode of the leaky surface acoustic wave. The characteristics shown in FIG. 6 also result from the use of the quartz substrate with the above-mentioned Euler angle.

FIG. 8 reveals that the electromechanical coupling coefficient of the fundamental mode of the leaky surface acoustic wave can also be made high by setting the normalized film thickness $H/\lambda$ of the ZnO thin film within the range of about 0.01 to about 0.15 in the surface acoustic wave device 5 shown in FIGS. 2A and 2B.

Figure 9:
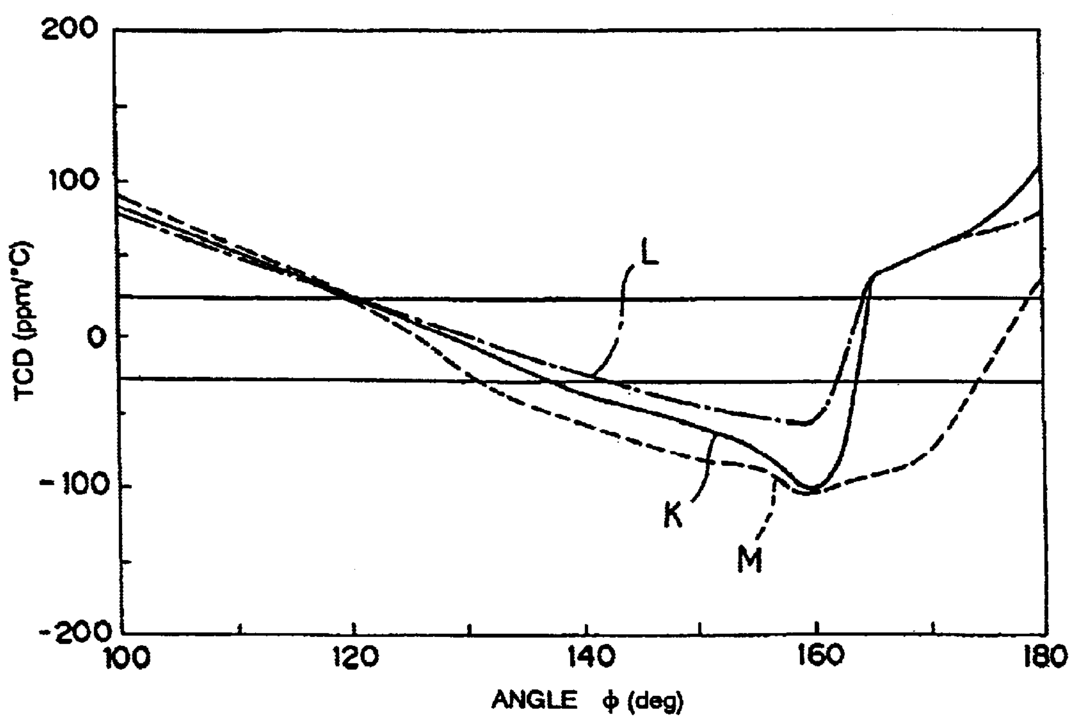
FIG. 9 shows the relationship between the TCD in,the surface acoustic wave device shown in FIGS. 1A and 1B and the angle $\phi$ at the Euler angle (0, $\phi$, 90°) and various normalized film thicknesses $H/\lambda$.

FIG. 9 shows the relationship between the TCD in the surface acoustic wave device shown in FIGS. 1A and 1B and the angle $\phi$ at the Euler angle (0, $\phi$, 90°) and various normalized film thicknesses $H/\lambda$. In FIG. 9, the lines K, L and M represent the cases where $H/\lambda$s are set at about 0.032, about 0.044 and about 0.009, respectively.

FIG. 9 reveals that, even if any of the above ZnO thin films having the three thicknesses mentioned above is formed, the TCD of the surface acoustic wave device is within the range of 0±20 ppm/° C. by setting the angle $\phi$ within the range of about 119° to about 138° and the range of about 162° to about 178° and setting the normalized film thickness $H/\lambda$ of the ZnO thin film at the aforementioned value.

For the aforementioned reasons, it is preferable to use a quartz substrate having a Euler angle (0, 119°–138°, 85°–95°) and (0, 162°–178°, 85°–95°) to obtain a surface acoustic wave device having an excellent TCD.

Although FIG. 9 shows the results of the surface acoustic wave device shown in FIGS. 1A and 1B, it has been confirmed that the TCD is excellent in the surface acoustic wave devices 5 and 7 shown in FIGS. 2A, 2B, 3A and 3B by setting the Euler angle at the aforementioned value.

Figure 10:
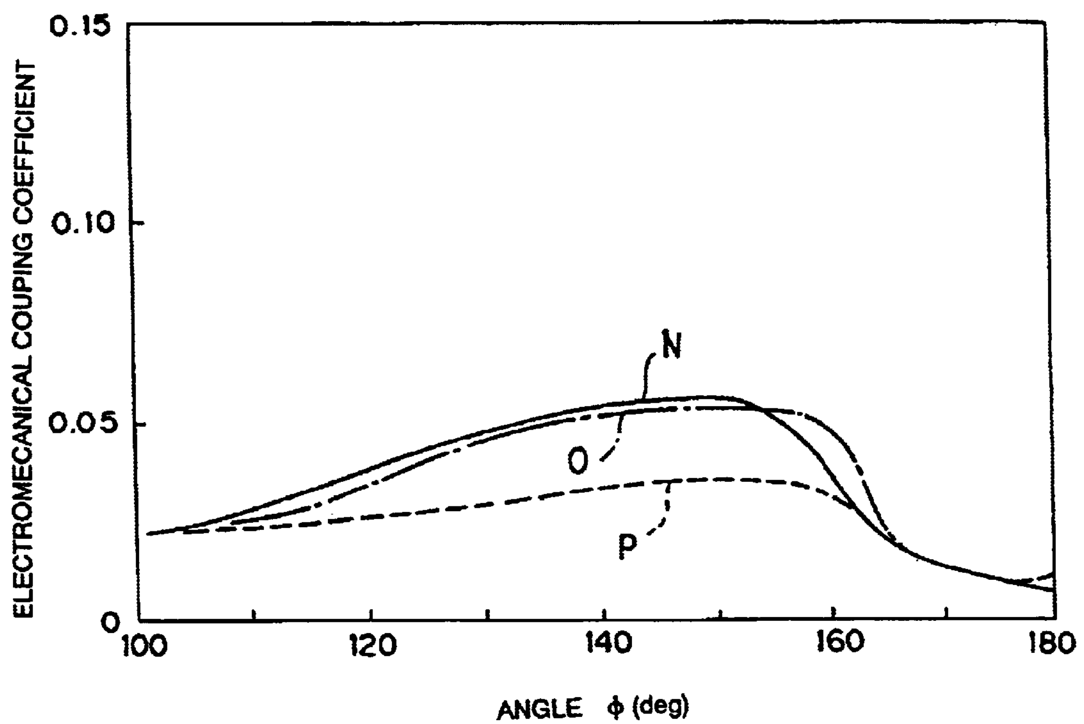
FIG. 10 is a graph showing the relationship between the electromechanical coupling coefficient of the surface acoustic wave device shown in FIGS. 1A and 1B and the angle $\phi$ at the Euler angle (0, $\phi$, 90°) and various normalized film thicknesses $H/\lambda$.

FIG. 10 is a graph showing the relationship between the electromechanical coupling coefficient k of the surface acoustic wave device shown in FIGS. 1A and 1B and the angle $\phi$ at the Euler angle (0, $\phi$, 90°) and various normalized film thicknesses $H/\lambda$.

In FIG. 10, the lines N, O and P represent the cases where the values of $H/\lambda$ are set at about 0.032, about 0.044 and about 0.009, respectively.

As is shown in FIG. 10, it is preferable that an angle $\phi$ is selected to have a value within the range of about 119° to about 167° from the standpoint of improving the electromechanical coupling coefficient k. According to further research, it has been confirmed that a large electromechanical coupling coefficient can be obtained by setting the angle $\phi$ within the above specified range in the surface acoustic wave devices 5 and 7 shown in FIG. 2A, 2B, 3A and 3B. Thus, it has been confirmed that the angle $\phi$ is preferably within the range of about 119° to about 167° so that the large electromechanical coupling coefficient is obtained.

In view of the foregoing results, it is more preferable that the surface acoustic wave device according to the preferred embodiments has a quartz substrate with Euler angle (0, 119°–138°, 85°–95°) and the normalized thickness $H/\lambda$ of the piezoelectric thin film within the range of about 0.01 to about 0.15.

Although the surface acoustic wave device according to the preferred embodiments of the present invention is explained as a transversal type filter, the surface acoustic wave device according to the present invention may be a resonator or a resonator type filter. Moreover, the resonator may be either a resonator having grating reflectors or a substrate edge surface reflection type resonator.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave device comprising:

a quartz substrate;

a piezoelectric thin film disposed on the quartz substrate and having a positive temperature coefficient of delay; and an interdigital electrode disposed in contact with the piezoelectric thin film; wherein the quartz substrate has an angle $\phi$ at the Euler angle (0, $\phi$, $\theta$) which is selected such that the quartz substrate has a negative temperature coefficient of delay at a predetermined propagation direction $\theta$, and the piezoelectric thin film has a thickness H which is selected such that a fundamental mode of a leaky surface acoustic wave is excited on the quartz substrate and the surface acoustic wave device operates using the fundamental mode of the leaky surface acoustic wave; and the propagation direction $\theta$ is in a range of about 85° to about 95°.

2. A surface acoustic wave device according to claim 1, wherein a normalized film thickness $H/\lambda$ obtained by dividing the thickness H of the piezoelectric thin film by a wavelength $\lambda$ of the leaky surface acoustic wave to be excited is within a range of about 0.01 to about 0.15.

3. A surface acoustic wave device according to claim 1, wherein the angle $\phi$ is within a range of about 119° to about 167°.

4. A surface acoustic wave device according to claim 1, wherein the angle $\phi$ is within a range of about 119° to about 138°.

5. A surface acoustic wave device according to claim 1, wherein the piezoelectric thin film is made of a material selected from the group consisting of ZnO, AlN, $Ta_2O_5$, or CdS.

6. A surface acoustic wave device according to claim 5, wherein the piezoelectric thin film is made of ZnO.

7. A surface acoustic wave device according to claim 1, wherein said interdigital electrode is located between the piezoelectric thin film and the quartz substrate.

8. A surface acoustic wave device according to claim 7, further comprising a ground electrode disposed on the piezoelectric thin film.

* * * * *